US010416332B2

(12) United States Patent
Lin

(10) Patent No.: US 10,416,332 B2
(45) Date of Patent: Sep. 17, 2019

(54) CONDUCTOR TRACING INSTRUMENTS

(71) Applicant: Fluke Corporation, Everett, WA (US)

(72) Inventor: Sidney Siang Lin, Bothell, WA (US)

(73) Assignee: Fluke Corporation, Everett, WA (US)

( * ) Notice: Subject to any disclaimer, the term of this patent is extended or adjusted under 35 U.S.C. 154(b) by 284 days.

(21) Appl. No.: 15/293,131

(22) Filed: Oct. 13, 2016

(65) Prior Publication Data

US 2018/0106923 A1    Apr. 19, 2018

(51) Int. Cl.
| | |
|---|---|
| *G01R 29/08* | (2006.01) |
| *G01V 3/08* | (2006.01) |
| *G08B 21/18* | (2006.01) |
| *G01V 3/10* | (2006.01) |
| *G01V 3/165* | (2006.01) |

(52) U.S. Cl.
CPC .......... *G01V 3/081* (2013.01); *G01R 29/085* (2013.01); *G01V 3/104* (2013.01); *G01V 3/165* (2013.01); *G08B 21/18* (2013.01)

(58) Field of Classification Search
CPC .............................. G01V 3/081; G01R 29/085
USPC .......................................................... 324/67
See application file for complete search history.

(56) References Cited

U.S. PATENT DOCUMENTS

| 6,525,665 B1 | 2/2003 | Luebke et al. |
| 7,253,636 B2 | 8/2007 | Shambaugh, Jr. et al. |
| 2001/0007420 A1* | 7/2001 | Bijawat .................... G01V 3/15 324/67 |
| 2013/0127448 A1 | 5/2013 | Hyacinthe et al. |
| 2014/0218036 A1 | 8/2014 | Fry |

OTHER PUBLICATIONS

Extended European Search Report, dated Mar. 22, 2018, for European Application No. 17196461.2-1022, 10 pages.

* cited by examiner

*Primary Examiner* — Reena Aurora
(74) *Attorney, Agent, or Firm* — Seed Intellectual Property Law Group LLP

(57) ABSTRACT

One or more embodiments are directed to conductor tracing instruments that include a receiver for detecting an energized conductor and methods for detecting an energized conductor. The receiver includes a plurality of sensors configured to sense magnetic fields produced by the energized conductor and a feedback mechanism configured to communicate information to a user regarding the magnetic fields being sensed. At least two of the sensors are configured to sense magnetic fields having directions of magnetic force that are different from each other. In one embodiment, the sensors are positioned so as to sense magnetic fields having directions of magnetic force that are perpendicular to each other. A change in information provided by the feedback mechanism communicates a change in direction of the energized conductor being detected by the receiver.

19 Claims, 4 Drawing Sheets

CONDUCTOR TRACING INSTRUMENTS

BACKGROUND

Technical Field

The present disclosure generally pertains to conductor tracing instruments and methods of tracing an energized conductor.

Description of the Related Art

Conductor tracing instruments are often used to trace electrical conductors, locate faults in conductors, and locate breakers and fuses, all of which may be hidden from view from a user. For instance, a user may be interested in tracing a conductor's path, which may be located behind a building structure, such as a wall, floor, or ceiling, in the building. Rather than breaking open a wall, the conductor tracing instrument may be used at a surface of the wall to trace an energized conductor on the other side of the wall.

Generally described, conductor tracing instruments include a transmitter and a receiver. The transmitter is configured to energize the conductor by drawing or injecting a current into the conductor as is well known in the art. In response to current flowing through the conductor, the energized conductor generates a magnetic field. Typically, the receiver of the conductor tracing instrument includes a sensor region that includes a sensor configured to detect the magnetic field generated by the energized conductor.

To properly detect the magnetic field, the sensor must be suitably aligned with the direction of magnetic force of the magnetic field. This can be difficult since in many cases the user cannot see the energized conductor. Thus, the user must rotate the sensor region of the receiver in front of the wall until the sensor is suitably aligned with the direction of magnetic force and the receiver indicates a magnetic field has been detected. Similarly, as the energized conductor changes direction behind the wall, the user may have to move the sensor region of the receiver around on the wall to determine which direction the conductor now extends.

BRIEF SUMMARY

One or more embodiments are directed to conductor tracing instruments that include a receiver for tracing an energized conductor and methods for detecting an energized conductor. The receiver includes a plurality of sensors configured to sense magnetic fields and a feedback mechanism configured to communicate information to a user regarding the magnetic fields being sensed. At least two of the sensors are positioned in the receiver at different angles from each other so that they sense magnetic fields having directions of magnetic force that are different from each other. In at least one embodiment, the directions of magnetic force are perpendicular to each other.

One embodiment is directed to a receiver of a conductor tracing instrument. The receiver includes a first sensor and second sensor. The first sensor is configured to sense a first magnetic field having a first direction of magnetic force and the second sensor is configured to sense a second magnetic field having a second direction of magnetic force. The second direction is different from the first direction. The receiver further includes first and second indicators. The first indicator is coupled to the first sensor and the second indicator is coupled to the second sensor. The first sensor is configured to activate the first indicator in response to the first sensor sensing the first magnetic field. Similarly, the second sensor is configured to activate the second indicator in response to the second sensor sensing the second magnetic field.

Another embodiment is directed to a method of detecting an energized conductor. The method includes placing a first inductor and a second inductor proximate to an energized conductor. The first inductor is positioned at an angle relative to the second inductor. The method includes using the first inductor, detecting a first magnetic field generated by the energized conductor. The first magnetic field has a first direction of magnetic force. The method includes in response to detecting the first magnetic field, activating a first indicator to indicate that the first magnetic field has been detected. The method includes using the second inductor, detecting a second magnetic field generated by the energized conductor. The second magnetic field has a second direction of magnetic force that is different from the first direction. The method includes in response to detecting the second magnetic field, activating a second indicator to indicate that the second magnetic field has been detected.

Yet another embodiment is directed to a conductor tracing instrument comprising a transmitter and a receiver. The transmitter is configured to energize a conductor and the receiver is configured to sense the energized conductor. The receiver includes a first sensor, a second sensor, and a feedback mechanism. The first sensor is configured to sense a first magnetic field having a first direction of magnetic force. The second sensor is configured to sense a second magnetic field having a second direction of magnetic force. The second direction is different from the first direction. The feedback mechanism is configured to communicate to a user sensing of the first magnetic field by the first sensor and sensing of the second magnetic field by the second sensor.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Embodiments described herein are directed to a conductor tracing instrument that includes a transmitter for energizing a conductor and a receiver for tracing the energized conductor. The receiver includes two or more sensors for detecting magnetic fields generated by the energized conductor. In particular, the sensors are configured to detect magnetic fields having different directions of magnetic force. In at least one embodiment, the sensors are arranged in the receiver so that at least two of the sensors sense magnetic fields having directions of magnetic force that are nonparallel with each other. In at least one embodiment, the directions of magnetic force are perpendicular to each other. The receiver further includes a feedback mechanism that notifies the user which sensor(s) are detecting the energized conductor, thereby communicating to the user when the conductor changes direction. In some embodiments, the feedback mechanism indicates the intensity of the detected magnetic field, which may also communicate to the user that the conductor is changing or has changed direction.

Figure 1:
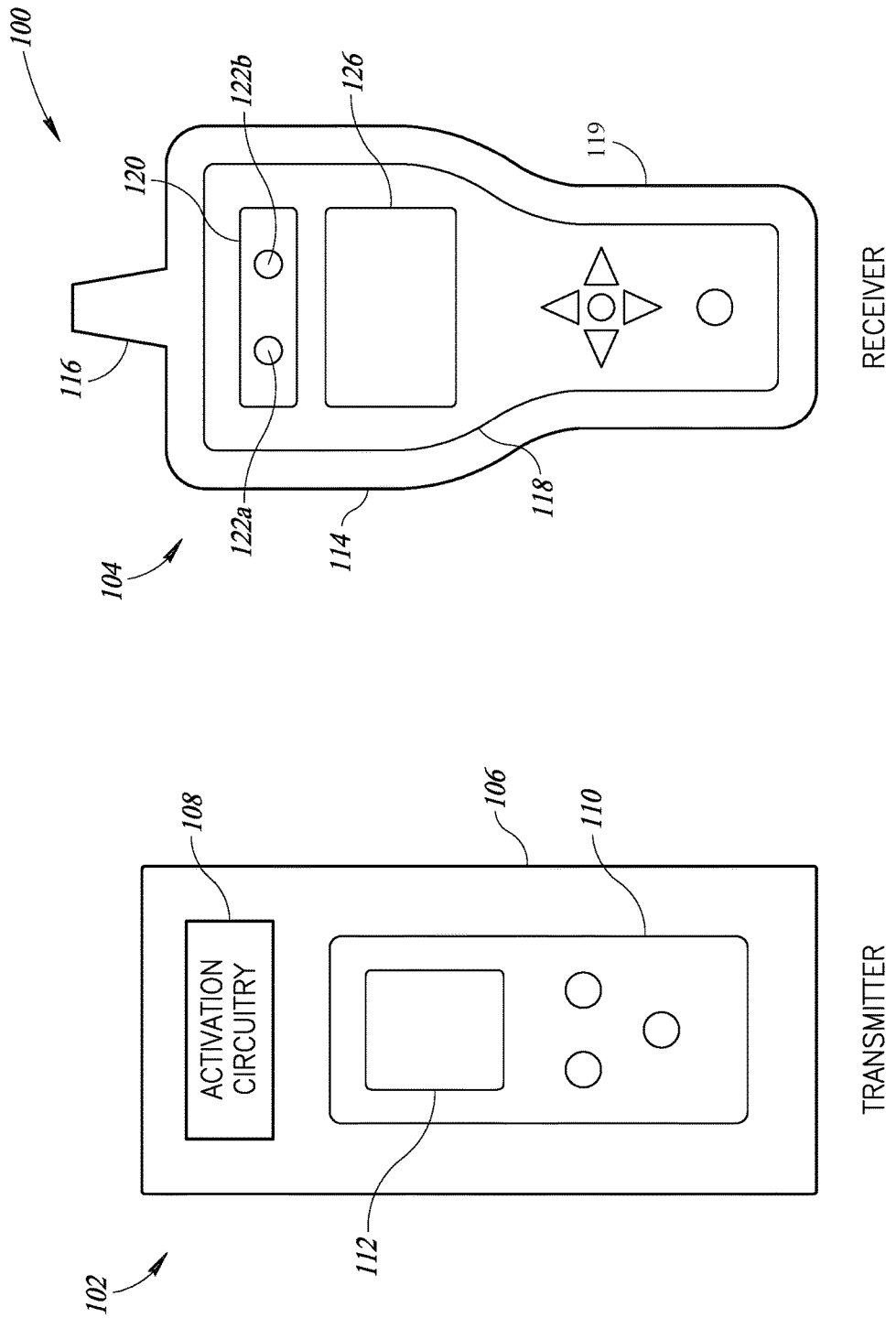
FIG. 1 is a schematic illustration of a conductor tracing instrument in accordance with one embodiment.

FIG. 1 is a schematic illustration of a conductor tracing instrument 100 in accordance with at least one embodiment. The conductor tracing instrument 100 includes a transmitter 102 and a receiver 104. The transmitter 102 is configured to energize conductors by drawing or injecting a current into the conductor as is well known in the art. For instance, the transmitter 102 may send pulsed signals through the conductor. Generally described, the transmitter 102 includes a housing 106 that houses activation circuitry 108, a user input/output interface 110, and a coupling element (not shown). The transmitter 102 may include further electrical components, such as a processor and memory, not shown. The user input/output interface 110 may include entry keys, knobs, buttons, and/or a display 112 that interact with the electrical components of the transmitter, such as to activate the activation circuitry 108.

In use, a user couples the coupling element of the transmitter 102, which may be an outlet plug, to an outlet coupled to the conductor to be tested, and inputs into the input/output interface 110 a desired electrical parameter for energizing the conductor. The display 112 may display information related to one or more electrical parameters, such as the voltage, of the activated conductor.

The receiver 104 is configured to detect an energized conductor, such as a conductor that has been energized by the transmitter 102. For instance, the receiver is configured to detect modulated signals that energize the conductor. The receiver 104 includes a housing 114 that includes a sensor region 116, an input/output interface 118, and a handle portion 119 that a user holds when tracing the energized conductor.

The sensor region 116 includes a plurality of sensors (130a, 130b in FIG. 3) for detecting magnetic fields generated by the energized conductor. The plurality of sensors may detect magnetic fields having different directions of magnetic force and/or magnetic fields having different locations of origin or source. For instance, in one embodiment (FIG. 3) two sensors are oriented nonparallel to each other so that the two sensors are able to detect magnetic fields having different directions of magnetic force. In another embodiment (FIG. 4) the plurality of sensors is three sensors, in which first and second sensors detect magnetic fields having different directions and a third sensor detects a magnetic field having the same direction of magnetic force as the first sensor. The first and third sensors, however, are spaced apart from each other so that they detect different magnetic fields, i.e. at different locations, or at least at different intensities of the magnetic fields. Although embodiments in which two and three sensors will be discussed in detail herein, it is to be appreciated that the sensor region 116 may include any number of sensors in any number of orientations.

In operation, the user holds the handle portion 119 so that the sensor region 116 is placed proximate to a conductor to be traced, such as on a wall or floor near the energized conductor.

The input/output interface 118 includes a feedback mechanism 120 for communicating information to a user regarding which one of the plurality of sensors is detecting a magnetic field. When the information provided by the feedback mechanism 120 changes, the change of information communicates to a user tracing an energized conductor that the conductor has changed direction and, in some cases, the direction at which the conductor has changed.

The feedback mechanism 120 includes a plurality of indicators 122, such as a primary indicator 122a and at least one rotational indicator 122b, for indicating which of the plurality of sensors is actively sensing a magnetic field at a given time. In the embodiment shown, each of the plurality of sensors of the sensor region 116 is coupled to a respective one of the primary and rotational indicators 122a, 122b of the feedback mechanism 120, e.g., by respective wires.

The primary and rotational indicators 122a, 122b of the feedback mechanism 120 may be visual elements, such as lights, vibration elements, and/or audio elements, such as speakers, configured to provide information to the user regarding which sensors are detecting magnetic fields. The primary and rotational indicators 122a, 122b may be further operable to indicate the intensity of the detected magnetic field. Although not shown, the primary and rotational indicators 122a, 122b may indicate to the user the direction at which the conductor extends based on which of the sensors of the plurality of sensors are detecting a magnetic field or which of the sensors are detecting a stronger magnetic field. For instance, by comparing the relative strength or intensity of the magnetic fields sensed by each of the sensors 130a, 130b, the primary and rotational indicators 122a, 122b may display arrows to indicate the direction of the conductor.

The input/output interface 118 of the receiver 104 may further include entry keys, knobs, buttons, and/or a display 126 for displaying information regarding the detected magnetic fields.

Figure 2:
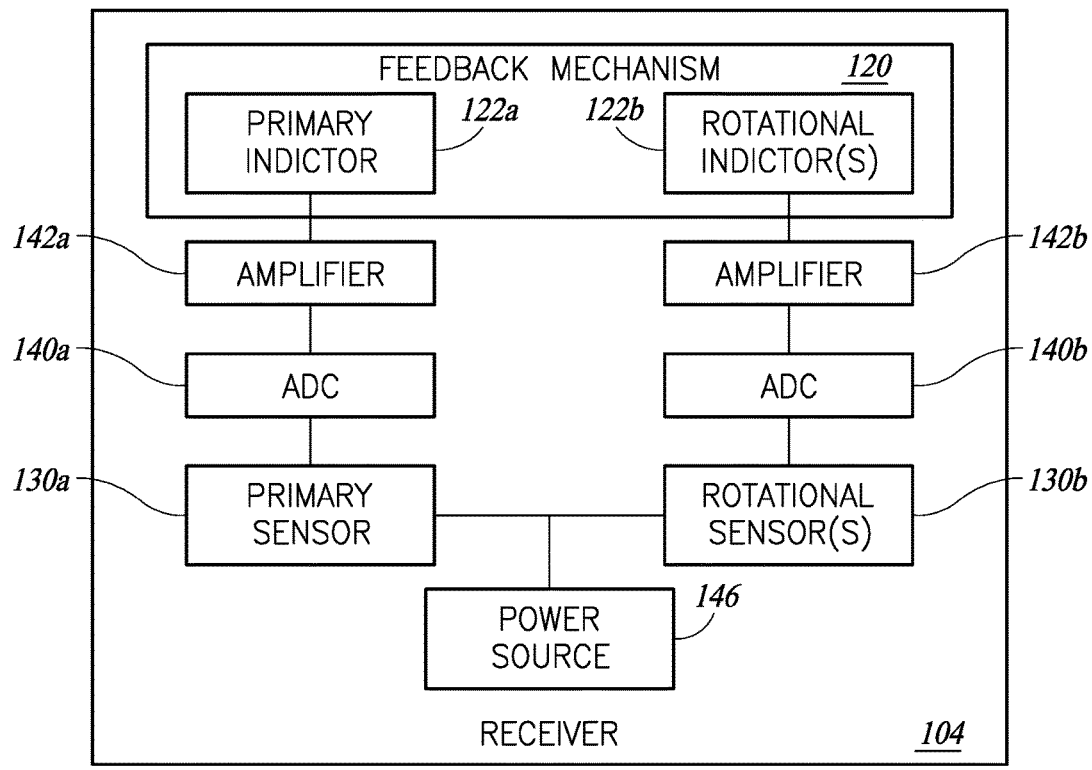
FIG. 2 is a block diagram of electrical components of the receiver of the conductor tracing instrument of FIG. 1 in accordance with one embodiment.

FIG. 2 is a block diagram of electrical components of the receiver 104 of the conductor tracing instrument 100 of FIG. 1 in accordance with one embodiment. The receiver 104 includes a primary sensor 130a and at least one rotational sensor 130b. The primary sensor 130a and the rotational sensor 130b may be inductor coils that detect magnetic fields produced by energized conductors. In particular, the primary sensor 130a is a first inductor coil having a first orientation and the rotational sensor 130b is a second inductor coil having a second orientation that is different from the first orientation of the first inductor coil. Thus, the first inductor coil of the primary sensor 130a is configured to detect a first magnetic field having a first direction of magnetic force, while the second inductor coil of the rotational sensor 130b is configured to detect a second magnetic field having a second direction of magnetic force.

It is to be appreciated that in the embodiment in which the receiver 104 includes a plurality of rotational sensors 130b, each of the rotational sensors 130b are inductor coils having different orientations with respect to the primary sensor 130a and are spaced apart from each other within the sensor region 116 such that each of the rotational sensors 130b are able to detect different magnetic fields, i.e. at different locations along a conductor to be traced.

The primary sensor 130a and the rotational sensor 130b are coupled to the feedback mechanism 120. In at least one embodiment, the feedback mechanism 120 includes the same number of indicators 122 as sensors 130 in the sensor region 116 of the receiver 104. Thus, in the illustrated embodiment the feedback mechanism 120 includes a primary indicator 122a and a rotational indicator 122b. The primary sensor 130a is coupled to the primary indicator 122a by a first wire (152a in FIG. 3) and the rotational sensor 130b is coupled to the rotational indicator 122b by a second wire (152b in FIG. 3).

Between the primary and rotational sensors 130a, 130b and the primary and rotational indicators 122a, 122b, respectively, are analog-to-digital converters (ADC) 140a, 140b, which convert the analog signals generated by the inductor coils of the primary and rotational sensors 130a, 130b to digital signals, and amplifiers 142a, 142b, which amplify the digital signals before providing the digital signals to the corresponding primary and rotational indicators 122a, 122b.

As indicated above, the primary and rotational indicators 122a, 122b may be visual elements, such as a light emitting diodes or lamps, that provide visual signals to a user regarding which sensors are sensing magnetic fields. Alternatively or in addition, the primary and rotational indicators 122a, 122b may be audio elements, such as speakers, that provide audio signals to the user regarding which sensors are sensing magnetic fields. Alternatively or in addition, the primary and rotational indicators 122a, 122b may be haptic elements that provide touch signals, such as vibrations, to the user regarding which sensors are sensing magnetic fields. The primary and rotational indicators 122a, 122b are configured to indicate when the primary and rotational sensors 130a, 130b, respectively, are sensing magnetic fields.

The primary and rotational indicators 122a, 122 may be further configured to indicate intensity of the magnetic field being detected. In one instance, the indicators may provide visual information, such as a light that increases and decreases in illumination based on the intensity of the magnetic field being detected. Similarly, the visual element may be a light indicator strip, in which multiple lights on the strip light up as the intensity of the magnetic field detected increases. In one embodiment, the indicators 122a, 122b are not activated until the respective sensor 130a, 130b senses a magnetic field above a threshold intensity value.

The receiver 104 further includes a power source 146, which may be a battery or a plug for coupling to a main power supply. The power source 146 provides power to the electrical components for operating the receiver 104. Although not shown, the receiver 104 may further include other electrical components, such as a programmed controller or a memory for storing information related to a conductor that is detected.

Figure 3:
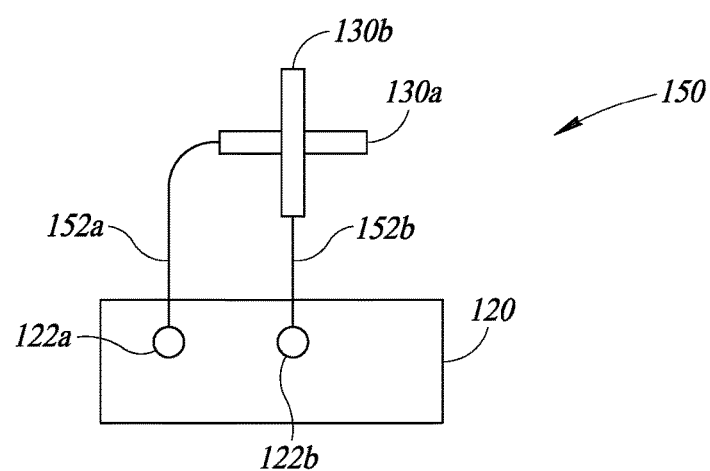
FIG. 3 is a schematic illustration of an arrangement of a sensor region and feedback mechanism of a receiver in accordance with one embodiment.

FIG. 3 is a schematic illustration of an arrangement 150 of a receiver, such as the receiver 104 of FIGS. 1 and 2. The arrangement 150 is representative of the sensor region 116 and the feedback mechanism 120 of the receiver 104. In particular, the arrangement 150 shows primary and rotational indicators 122a, 122b of the feedback mechanism 120 of the receiver 104.

In the arrangement 150 of FIG. 3, the primary sensor 130a is arranged perpendicular to the rotational sensor 130b. Thus, the primary sensor 130a is configured to detect a magnetic field having a first direction of magnetic force, while the rotational sensor 130b is configured to detect a magnetic field having a second direction of magnetic force that is perpendicular to the first direction.

As shown in FIG. 3, the primary sensor 130a is coupled to the primary indicator 122a of the feedback mechanism 120 by a first wire 152a. The primary indicator 122a indicates to the user when the primary sensor 130a is detecting a magnetic field. Similarly, the rotational sensor 130b is coupled to the rotational indicator 122b of the feedback mechanism 120 by a second wire 152b. The rotational indicator 122b indicates to the user when the rotational sensor 130b is detecting a magnetic field.

In use, the sensor region 116 of the receiver 104 is placed proximate to an energized conductor. The energized conductor generates a magnetic field around the energized conductor. The primary sensor 130a and the secondary sensor 130b sense the magnetic field generated by the energized conductor. The magnetic field generated by the energized conductor will be referred to herein as different magnetic fields, such as first, second, and third magnetic fields, at different locations along the energized conductor. That is, at a first location of the energized conductor, a first magnetic field is sensed; and at a second location of the energized wire, a second magnetic field is sensed. Furthermore, at the different locations along the energized wire the different magnetic fields may have different directions from each other. For instance, if the energized conductor has a first portion that extends horizontally and a second portion that extends vertically, a first magnetic field at a first location of the first portion will have a different direction of magnetic force than a second magnetic field at a second location of the second portion.

In response to the primary sensor 130a detecting a magnetic field, the primary sensor 130a, which may be an inductor coil, induces a current in the first wire 152 coupled to the primary sensor 130a, thereby activating the primary indicator 122a. Similarly, in response to the rotational sensor 130b detecting a magnetic field, the rotational sensor 130b, which may also be an inductor coil, induces a current in the second wire 152b coupled to the rotational sensor 130b, thereby activating the rotational indicator 122b. Thus, the primary and rotational indicators 122a, 122b communicate to a user which sensor, the primary sensor 130a or the rotational sensor 130b, is currently sensing a magnetic field.

The primary and rotational indicators 122a, 122b thus communicate information to the user about the energized conductor. For instance, the information may indicate that the conductor is oriented in a certain direction, that the conductor is changing or has changed direction, or that the primary or rotational sensors 130a, 130b are misaligned with the magnetic fields generated by the energized conductor. For instance, if both the primary and rotational sensors 130a, 130b are sensing magnetic fields, the user may recognize that neither the primary sensor 130a nor the rotational sensor 130b is aligned with the conductor. Upon rotating the sensor region 116 so that the rotational sensor 130b no longer detects the magnetic field, the intensity of the magnetic field detected by the primary sensor 130a increases. In that regard, the orientation of the energized conductor is communicated to the user. Additionally, if the primary sensor 130a is detecting a magnetic field and is aligned with the conductor, and then, as the receiver is moved along the length of the conductor the rotational sensor 130b begins to detect a magnetic field while the primary sensor 130a ceases detecting a magnetic field, the user may recognize that the energized conductor has changed direction, as will be discussed in more detail below in reference to FIGS. 5A and 5B.

Although the rotational sensor 130b is shown oriented perpendicular to the orientation of the primary sensor 130a in the illustrated embodiment, the rotational sensor 130b may be oriented at any nonzero angle relative to the primary sensor 130a, such as 30°, 45°, 60°, etc., relative to the primary sensor 130a, so long as the rotational sensor 130b is rotated relative to the primary sensor 130a and, thus, configured to sense a magnetic field having a different direction of magnetic force.

Figure 4:
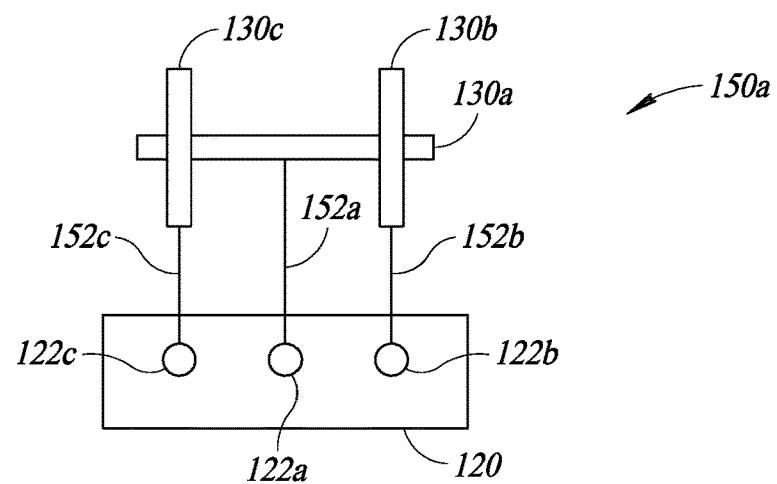
FIG. 4 is a schematic illustration of an arrangement of a sensor region and feedback mechanism of a receiver in accordance with another embodiment.

FIG. 4 is a schematic illustration of an arrangement 150a of a receiver, such as the receiver 104 of FIGS. 1 and 2 in accordance with another embodiment. The arrangement 150a differs from the arrangement 150 of FIG. 3 in that the arrangement 150a includes three sensors and a feedback mechanism that includes three indicators. In particular, the arrangement 150a includes a primary sensor 130a and first and second rotational sensors 130b, 130c.

The first and second rotational sensors 130b, 130c are arranged perpendicular to the primary sensor 130a and are spaced apart from each other. Thus, the primary sensor 130a is configured to sense a magnetic field that has a direction of magnetic force that is perpendicular to the directions of magnetic force of the magnetic fields detected by the first and second rotational sensors 130b, 130c. In addition, the first and second rotational sensors 130b, 130c sense magnetic fields having magnetic forces that are in the same direction as each other but are spaced apart from each other. In particular, the first rotational sensor 130b is spaced apart from the second rotational sensor 130c such that when the first rotational sensor 130b senses a magnetic field, the second rotational sensor 130c does not sense the magnetic field or at least senses the magnetic field with less intensity.

As shown in FIG. 4, the primary sensor 130a and the first and second rotational sensors 130b, 130c are coupled to primary indicator 122a and rotational indicators 122b, 122c of the feedback mechanism 120 by first, second, and third wires 152a, 152b, 152c, respectively. In particular, the primary sensor 130a is coupled to a primary indicator 122a by a first wire 152a, the first rotational sensor 130b is coupled to a first rotational indicator 122b by a second wire 152b, the second rotational sensor 130c is coupled to a second rotational indicator 122c by a third wire 152c. Each indicator 122a, 122b, 122c indicates when the respective sensor 130a, 130b, 130c is sensing a magnetic field.

Figure 5A:
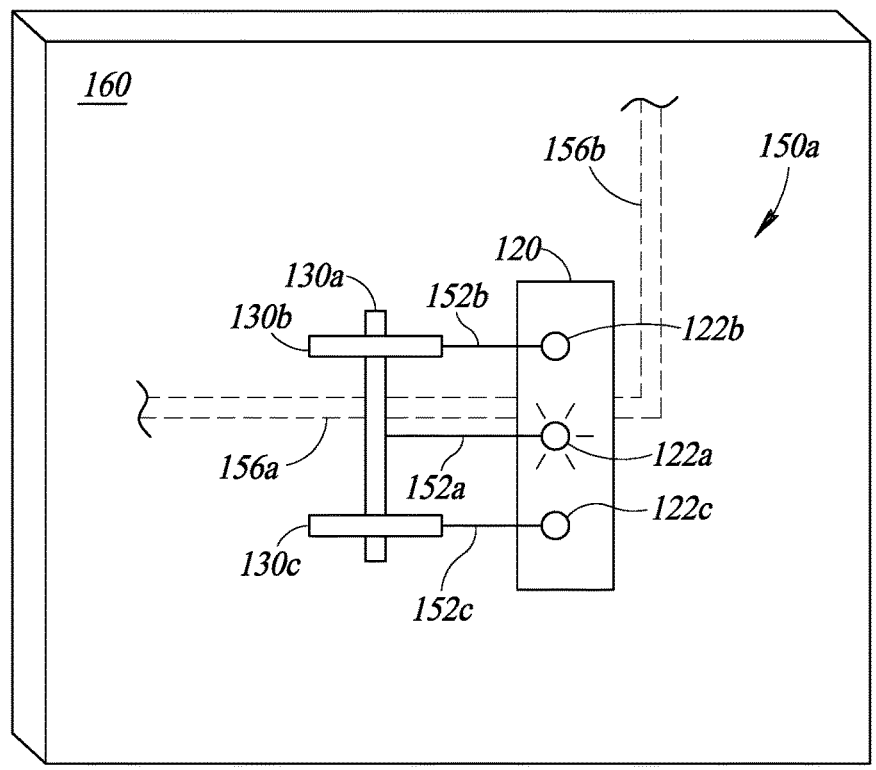
FIGS. 5A and 5B are schematic illustrations showing the orientation of FIG. 4 being used to detect an energized conductor in accordance with one embodiment.
Figure 5B:
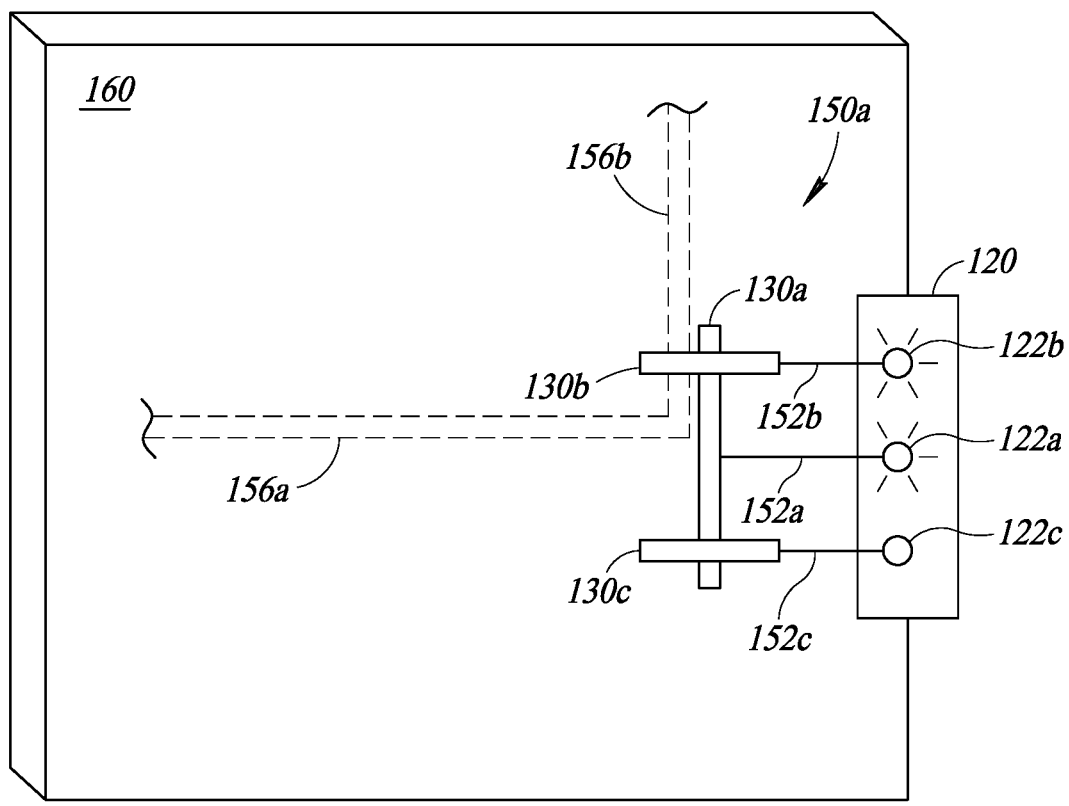

FIGS. 5A and 5B are schematic illustrations of the arrangement 150a of FIG. 4 being used to detect an energized conductor 156a, 156b in accordance with one embodiment. The conductor has been energized by a transmitter, such as by the transmitter 102 in FIG. 1. In particular, the activation circuitry 108 of the transmitter 102 causes pulsed signals to flow through the conductor. The energized conductor 156a, 156b generates a magnetic field that surrounds the energized conductor. When a sensor in the sensor region 116 of the receiver 104 is placed in the magnetic field and is aligned with the direction of magnetic force of the magnetic field, the sensor detects the magnetic field. As mentioned above, the magnetic field sensed at different locations along the energized conductor will be referred to as different magnetic fields, such as first, second, and third magnetic fields. The direction of the energized wire at the particular location at which the sensor is sensing the magnetic field will generally determine the direction of the respective magnetic field being sensed.

In FIGS. 5A and 5B, the energized conductor is a wire located behind a wall 160 and, thus, is shown in dashed line. The wire includes a first portion 156a that is horizontal and a second portion 156b that is vertical. A receiver having the arrangement 150a of FIG. 4 is placed in front of the wall 160.

In FIG. 5A, the arrangement 150a is oriented in a first position such that the primary sensor 130a is perpendicular to the first portion 156a of the wire and, thus, senses the magnetic field generated by current flowing in the first portion 156a of the wire. In response to the primary sensor 130a sensing the magnetic field created by the first portion 156a of the wire, the primary sensor 130a induces a current in the wire 152a coupling the primary sensor 130a to the primary indicator 122a, thereby activating the primary indicator 122a, which in this embodiment is a light.

In the first position shown in FIG. 5A, the first and second rotational sensors 130b, 130c are not oriented to detect the magnetic field generated by the first portion 156a of the wire. That is, the first and second rotational sensors 122b, 122c are parallel to the first portion 156a of the wire and thus cannot detect the magnetic force of the magnetic field generated by the first portion 156a of the wire. Furthermore, the first and second rotational sensors 122b, 122c are spaced from the second portion 156b of the wire and, thus, do not detect the magnetic field generated by the second portion 156b.

FIG. 5B illustrates the arrangement 150a (the receiver) having moved along the first portion 156a of the wire to a second position that is proximate to a corner of the first and second portions 156a, 156b. In the second position, the primary sensor 130a continues to sense the magnetic field generated by the first portion 156a of the wire. Thus, the primary indicator 122a continues to indicate that a magnetic field is detected, albeit a magnetic field of reduced intensity.

Additionally, the first rotational sensor 130b is perpendicular to the second portion 156b of the wire. In that regard, the first rotational sensor 130b senses the magnetic field created by the second portion 156b of the wire, and in response, the first rotational sensor 130b induces a current in the second wire 152b coupling the first rotational sensor 130b to the first rotational indicator 122b, thereby activating the first rotational indicator 122b, which (in this embodiment) is a light.

In this position, the second rotational sensor 130c is also perpendicular to the direction of the second portion 156b of the wire. The second rotational sensor 130c, however, is spaced from the second portion 156b of the wire and, thus, does not detect the magnetic field generated by the second portion 156b of the wire, or at least does not suitably detect it above a threshold value to activate the second rotational indicator 122c.

In another embodiment, however, the second rotational indicator 122c induces a current in the third wire 152c coupling the second rotational sensor 130c to the second rotational indicator 122c, but indicates a lower intensity signal than the first rotational indicator 122b to indicate that a lower intensity magnetic field is detected by the second rotational sensor 130c.

Although the user is not able to see the wire behind the wall 160, by viewing the feedback mechanism 120 the user learns that the first portion 156a of the wire has changed direction. In particular, by activating the first rotational indicator 122b while the second rotational indicator 122c is not activated (or is activated but at a lower intensity), the receiver communicates to the user that the wire turns upward behind the wall. In that regard, although the user cannot see the wire, the user knows to move the receiver upward along the surface of the wall 160 in a direction that corresponds with the second portion 156b of the wire. As the arrangement 150a moves upward and away from the first portion 156a of the wire, the primary sensor 130a will stop sensing the magnetic field generated by the first portion 156a of the wire and, thus, the primary indicator 122a will become deactivated. It is to be appreciated, however, that as the arrangement 150a is moved upward, the second rotational indicator 122c will become activated. Additionally, the user may rotate the arrangement 150a as it is moved along the second portion 156b of the wire so that the primary sensor 130a is detecting the magnetic field generated by the second portion 156b of the wire, rather than the first and second rotational sensors 130b, 130c.

Conversely, if the second rotational indicator 122c was activated, while the first rotational indicator 122b was not activated (or is activated but at a lower intensity), this would communicate to the user that the wire turns downward behind the wall.

Although not shown, it is to be appreciated that as the first rotational sensor 130b moves closer to the second portion 156b of the wire, the first rotational sensor 130b may begin to sense the magnetic field generated by the second portion 156b at low intensities. If the low intensity is above a threshold level, the first rotational indicator 122b may be configured to indicate the detection of the magnetic field at a lower intensity than is indicated by the primary indicator 122a. This would communicate to the user that the wire is about to change direction as the user moves the arrangement 150a to the right toward the second portion 156b of the wire.

Furthermore, in some cases as the user moves the arrangement along the first portion 156a of the wire, all of the indicators 122a, 122b, 122c are indicating that the corresponding sensors 130a, 130b, 130c are sensing magnetic fields. This would communicate to the user that the sensors are misaligned with the first portion 156a of the wire. The user may then rotate the arrangement 150a (the receiver) until the primary indicator 122a is activated and the first and second rotational indicators 122b, 122c are deactivated to properly align the receiver with the first portion 156a of the wire.

Similarly, if the second portion 156b of the wire changes direction at an angle other than 90 degrees (relative to the first portion 156a), the sensors 130a, 130b, 130c may begin to simultaneously sense portions of the magnetic field produced by the energized conductor, causing multiple indicators 122a, 122b, 122c to indicate detection of a magnetic field. This change of information provided by the indicators 122a, 122b, 122c may suggest to the user that the wire has changed direction and prompt the user to rotate the arrangement 150a until the primary indicator 122a is activated (or indicates a maximum intensity of the sensed magnetic field) while the first and second rotational indicators 122b, 122c are deactivated (or indicate a minimum intensity of the sensed magnetic field), which confirms to the user that the receiver is aligned with the new direction of the wire.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A receiver of a conductor tracing instrument, the receiver comprising:
   a first sensor configured to sense a first magnetic field having a first direction of magnetic force;
   a second sensor configured to sense a second magnetic field having a second direction of magnetic force, the second direction being different from the first direction; and
   first and second indicators configured to indicate which of the first and second sensors is actively sensing a magnetic field at a given time, the first indicator coupled to the first sensor, the second indicator coupled to the second sensor, wherein at the given time the first sensor is configured to activate the first indicator in response to the first sensor sensing the first magnetic field, while the second sensor is configured to activate the second indicator in response to the second sensor sensing the second magnetic field.

2. The receiver of claim 1, wherein the second direction is perpendicular to the first direction.

3. The receiver of claim 1, wherein the first and second indicators are at least one of visual elements and audio elements.

4. The receiver of claim 1, wherein at least one of the first and second indicators is configured to indicate an intensity of the first and second magnetic fields being sensed.

5. The receiver of claim 1, further comprising:
   a third sensor configured to sense a third magnetic field having a third direction of magnetic force, the third direction being different from either the first direction or the second direction; and
   a third indicator coupled to the third sensor, the third sensor being configured to activate the third indicator in response to the third sensor sensing the third magnetic field.

6. The receiver of claim 5, wherein the third direction of magnetic force sensed by the third sensor is parallel to the second direction of magnetic force sensed by the second sensor.

7. The receiver of claim 5, wherein the first, second, and third sensors are coupled, respectively, to the first, second, and third indicators by respective first, second, and third wires, and wherein the first, second, and third sensors are first, second, and third inductor coils, respectively, configured to induce currents in the first, second, and third wires that respectively provide currents to the first, second, and third indicators in response to sensing the first, second, and third magnetic fields, respectively.

8. A method of detecting an energized conductor, the method comprising:
   placing a first inductor and a second inductor proximate to an energized conductor, the first inductor positioned at an angle relative to the second inductor;
   at a given time, using the first inductor, detecting a first magnetic field generated by the energized conductor, the first magnetic field having a first direction of magnetic force;
   in response to detecting the first magnetic field, activating a first indicator to indicate that the first magnetic field has been detected;
   at the given time, using the second inductor, detecting a second magnetic field generated by the energized conductor, the second magnetic field having a second direction of magnetic force that is different from the first direction; and
   in response to detecting the second magnetic field, activating a second indicator to indicate that the second magnetic field has been detected.

9. The method of claim 8, wherein the first direction is at a nonzero angle relative to the second direction.

10. The method of claim 9, wherein the first direction is perpendicular to the second direction.

11. The method of claim 8, wherein the first indicator indicates a first direction at which a first portion of the energized conductor extends, and wherein the second indicator indicates a second, different direction at which a second portion of the energized conductor extends.

12. The method of claim 8, wherein:
   activating the first indicator comprises activating the first indicator at an intensity that corresponds to the intensity of the first magnetic field being detected by the first inductor; and
   activating the second indicator comprises activating the second indicator at an intensity that corresponds to the intensity of the second magnetic field being detected by the second inductor.

13. The method of claim 8, wherein activating the first indicator comprises activating a first visual element, and wherein activating the second indicator comprises activating a second visual element.

14. A conductor tracing instrument comprising:
   a transmitter configured to energize a conductor; and
   a receiver configured to sense the energized conductor, the receiver including:
      a first sensor configured to sense a first magnetic field having a first direction of magnetic force;
      a second sensor configured to sense a second magnetic field having a second direction of magnetic force, the second direction being different from the first direction; and
      a feedback mechanism including a first indicator and a second indicator, wherein the first indicator is coupled to the first sensor by a first wire and the second indicator is coupled to the second sensor by a second wire,
      wherein in response to the first sensor sensing the first magnetic field, the first sensor is configured to induce a current in the first wire that activates the first indicator,
      wherein in response to the second sensor sensing the second magnetic field, the second sensor is configured to induce a current in the second wire that activates the second indicator, and
      wherein the first sensor is configured to sense the first magnetic field at a same time the second sensor is configured to sense the second magnetic field.

15. The conductor tracing instrument of claim 14, wherein the first sensor is positioned at a nonzero angle relative to the second sensor.

16. The conductor tracing instrument of claim 14, wherein the first sensor is positioned perpendicular to the second sensor.

17. The conductor tracing instrument of claim 14, further comprising a third sensor configured to sense a magnetic field having a third direction of magnetic force, the third direction being different from either the first direction or the second direction.

18. The conductor tracing instrument of claim 17, wherein the third direction is parallel to the second direction.

19. The conductor tracing instrument of claim 17, wherein the first and third sensors are inductors, arranged parallel to each other in a spaced apart relationship with each other such that when the first sensor senses the first magnetic field, the third sensor does not sense the first magnetic field.

* * * * *